United States Patent
Kim et al.

(10) Patent No.: US 12,336,225 B2
(45) Date of Patent: Jun. 17, 2025

(54) THIN-FILM TRANSISTOR

(71) Applicant: Applied Materials, Inc., Santa Clara, CA (US)

(72) Inventors: Jung Bae Kim, San Jose, CA (US); Dong Kil Yim, Pleasanton, CA (US); Soo Young Choi, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 477 days.

(21) Appl. No.: 17/289,570

(22) PCT Filed: Jun. 4, 2020

(86) PCT No.: PCT/US2020/036134
§ 371 (c)(1),
(2) Date: Apr. 28, 2021

(87) PCT Pub. No.: WO2020/247640
PCT Pub. Date: Dec. 10, 2020

(65) Prior Publication Data
US 2022/0013670 A1    Jan. 13, 2022

Related U.S. Application Data (60) Provisional application No. 62/857,065, filed on Jun. 4, 2019.

(51) Int. Cl.
*H10D 30/67*    (2025.01)

(52) U.S. Cl.
CPC ..... *H10D 30/6757* (2025.01); *H10D 30/6713* (2025.01); *H10D 30/6733* (2025.01); *H10D 30/6755* (2025.01)

(58) Field of Classification Search
CPC ......... H01L 29/78696; H01L 29/78618; H01L 29/78645; H01L 29/7869; H01L 27/1222;
(Continued)

(56) References Cited

U.S. PATENT DOCUMENTS

2008/0296568 A1* 12/2008 Ryu .................. H01L 21/02565
257/43
2010/0301343 A1   12/2010 Qiu et al.
(Continued)

FOREIGN PATENT DOCUMENTS

CN     101794809 A    8/2010
CN     105917450 A    8/2016
(Continued)

OTHER PUBLICATIONS

Japanese Patent Application 2021-571521; Office Action dated Oct. 24, 2023.
(Continued)

*Primary Examiner* — Shouxiang Hu
(74) *Attorney, Agent, or Firm* — Patterson + Sheridan, LLP (57) ABSTRACT

Embodiments herein include thin-film transistors (TFTs) including channel layer stacks with layers having differing mobilities. The TFTs disclosed herein transport higher total current through both the low mobility and the high mobility channel layers due to higher carrier density in high mobility channel layer and/or the high mobility channel layers, which increases the speed of response of the TFTs. The TFTs further include a gate structure disposed over the channel layer stack. The gate structure includes one or more gate electrodes, and thus the TFTs are top-gate (TG), double-gate (DG), or bottom-gate (BG) TFTs. The channel layer stack includes a plurality of layers with differing mobilities. The layers with differing mobilities confer various benefits to the TFT. The high mobility layer increases the speed of response of the TFT.

8 Claims, 11 Drawing Sheets

(58) Field of Classification Search
CPC ........... H01L 27/1233; H01L 29/78648; H01L 29/1054; H01L 29/24; H10D 30/6757; H10D 30/6713; H10D 30/6733; H10D 30/6755; H10D 30/6734; H10D 86/421; H10D 86/427; H10D 86/60; H10D 30/751; H10D 62/80

See application file for complete search history.

(56) References Cited

U.S. PATENT DOCUMENTS

| | | | |
|---|---|---|---|
| 2011/0140100 | A1 | 6/2011 | Takata et al. |
| 2014/0054588 | A1* | 2/2014 | Maeda .............. H01L 29/78696 257/43 |
| 2015/0228803 | A1 | 8/2015 | Koezuka et al. |
| 2016/0071983 | A1* | 3/2016 | Yamazaki ......... H01L 29/78693 257/43 |
| 2016/0126355 | A1 | 5/2016 | Shih et al. |
| 2016/0329353 | A1 | 11/2016 | Goto et al. |
| 2019/0097059 | A1 | 3/2019 | Kikuchi et al. |
| 2023/0062926 | A1 | 3/2023 | Oh et al. |

FOREIGN PATENT DOCUMENTS

| | | |
|---|---|---|
| CN | 109585455 A | 4/2019 |
| JP | 2011124360 A | 6/2011 |
| JP | 2012059860 A | 3/2012 |
| JP | 2014057055 A | 3/2014 |
| JP | 2014143414 A | 8/2014 |
| JP | 201543443 A | 3/2015 |
| JP | 2015156482 A | 8/2015 |
| JP | 2015188063 A | 10/2015 |
| JP | 2015216282 A | 12/2015 |
| JP | 2016-171282 A | 9/2016 |
| JP | 201967791 A | 4/2019 |
| KR | 10-2007-0043243 A | 4/2007 |

OTHER PUBLICATIONS

International Search Report and Written Opinion dated Sep. 23, 2020 for PCT/US2020/036134.

Cambridge Dictionary of Science and Technology; Editor Peter M.B. Walker, CBE, FRSE, published by the Press Syndicate of the University of Cambridge, 1988.

Korean Office Action dated Feb. 29, 2024 for Application No. 10-2021-7043391.

Japanese Office Action dated Apr. 21, 2023 Application No. 2021-571521.

Chinese Office Action dated Jun. 27, 2024 for Application No. 202080041820.9.

Korean Office Action dated Oct. 30, 2024 for Application No. 10-2021-7043391.

Japanese Office Action dated Apr. 8, 2025 for Application No. 2024-087555, 9 pages.

Chinese Office Action dated Mar. 31, 2025 for Application No. 202080041820.9.

* cited by examiner

THIN-FILM TRANSISTOR

BACKGROUND

Field

Embodiments of the present disclosure generally relate to an apparatus and, more specifically, to a thin-film transistor.

Description of the Related Art

A thin-film transistor (TFT) is a type of metal-oxide-semiconductor field-effect transistor (MOSFET) made by depositing thin films of an active semiconductor layer, as well as the dielectric layer and metallic contacts, over a supporting substrate. A common substrate is glass, because one application of TFTs is in liquid-crystal displays (LCDs).

TFTs have gained significant interest in display applications due to their high resolution, low power consumption, and high speed operation for LCDs and organic light-emitting diode (OLED) displays. TFTs are embedded within the panel of the display. Data line and gate line voltage signals from display modules in the display system are delivered to TFTs in pixel circuits and/or gate driver circuits in peripheral display panel areas to control display images by turning on and off the TFTs. Image distortion is decreased by improving the response of TFT with higher mobility and/or by reducing crosstalk between pixels. Most display products including LCD televisions (TVs) and monitors include TFTs in the panel. Many modern high-resolution and high-quality electronic visual display devices use active matrix based displays with a large amount of TFTs. One beneficial aspect of TFT technology is its use of a separate TFT for each pixel on the display. Each TFT works as a switch or a source of current in pixel circuit or gate driver circuit by controlling voltage and current through data and gate signal lines for increased control of display images. Higher on current from high mobility TFT allows fast refresh of the display images and better image qualities by minimizing the distortion of data and gate signal voltages.

One drawback of TFTs in the art is that they can have unacceptably insufficient on current due to low channel mobilities, which limits the speed of response in the TFTs, especially for high resolution and/or large screen displays. It is often desired to use high mobility channel in TFTs to flow enough on current for fast response. However, high mobility TFTs typically have unacceptably high off-leakage current and negative threshold voltage (e.g., turn on voltage) in comparison to low mobility TFTs, due to highly conductive channel properties. For positive threshold voltage in TFTs, carrier concentration in the semiconductor channel at the interface between gate insulator and semiconductor channel can be reduced, which causes a drop in mobility. Therefore, it can be difficult to achieve both high mobility and positive threshold voltage in TFTs. Finally, TFTs in the art can have undesirably high off-leakage current and negative threshold voltage due to high carrier concentration in channel semiconductors, which increases display panel power consumption and can cause malfunction of the display panel.

Therefore, what is needed in the art are improved channel mobilities in TFTs with low off leakage current and positive threshold voltage (e.g., turn on voltage).

SUMMARY

Embodiments herein include thin-film transistors including channel layer stacks with layers with differing mobilities. The thin-film transistors (TFTs) disclosed herein transport higher total current through both the low mobility and the high mobility channel layers due to higher carrier density in high mobility channel layer and/or the high mobility channel layers, which increases the speed of response of the TFTs due to higher on current in the TFTs.

In one embodiment, a device is provided. The device includes a substrate, a multi-layer semiconductor channel of a first thin film transistor (TFT) disposed over the substrate, a first gate insulator layer disposed over the multi-layer semiconductor channel, a first gate electrode disposed over the first gate insulator layer, an inter-layer dielectric (ILD) layer disposed over the first gate electrode, a first source electrode contacting the multi-layer semiconductor channel, and a first drain electrode contacting the multi-layer semiconductor channel. The multi-layer semiconductor channel includes one or more stacks of two layers having alternating electron mobilities. The two layers include a first layer having a first electron mobility less than about 20 $cm^2/V \cdot s$, and a second layer contacting the first layer. The second layer has a second electron mobility greater than about 20 $cm^2/V \cdot s$. The first TFT has an electron mobility of about 35 $cm^2/V \cdot s$ to about 70 $cm^2/V \cdot s$. The first layer is in contact with the first gate insulator layer of the first TFT. The first source electrode is disposed in a first source electrode via of the ILD layer. The first drain electrode is disposed in a first drain electrode via of the ILD layer. The first TFT has a threshold voltage of about −0.5 V to about 2.5 V. T In another embodiment, a device is provided. The device includes a substrate, a multi-layer semiconductor channel of a first thin film transistor (TFT) disposed over the substrate, a first gate insulator layer disposed over the multi-layer semiconductor channel, a first gate electrode disposed over the first gate insulator layer, a first bottom gate electrode disposed over the substrate, an inter-layer dielectric (ILD) layer disposed over the first gate electrode, a first source electrode contacting the multi-layer semiconductor channel, and a first drain electrode contacting the multi-layer semiconductor channel. The multi-layer semiconductor channel includes one or more stacks of two layers having alternating electron mobilities. The two layers include a first layer having a first electron mobility less than about 20 $cm^2/V \cdot s$, and a second layer contacting the first layer. The second layer has a second electron mobility greater than about 20 $cm^2/V \cdot s$. The first TFT has an electron mobility of about 35 $cm^2/V \cdot s$ to about 70 $cm^2/V \cdot s$. The first layer of an uppermost stack of the one or more stacks is in contact with the first gate insulator layer of the first TFT. The first source electrode is disposed in a first source electrode via of the ILD layer. The first drain electrode is disposed in a first drain electrode via of the ILD layer. The first TFT has a threshold voltage of about −0.5 V to about 2.5 V.

In yet another embodiment, a device is provided. The device includes a substrate, an inter-layer dielectric (ILD) layer disposed over the substrate, a first thin film transistor (TFT), and a second TFT. The first TFT includes a multi-layer semiconductor channel disposed over the substrate, the multi-layer semiconductor channel including one or more stacks of two layers having alternating electron mobilities, the two layers including a first layer having a first electron mobility less than about 20 $cm^2/V \cdot s$ and a second layer contacting the first layer, the second layer having a second electron mobility greater than about 20 $cm^2/V \cdot s$, a first bottom gate electrode disposed over the substrate, a first bottom insulator layer disposed over the first bottom gate electrode, a first source electrode electrically contacting the multi-layer semiconductor channel, and a first drain electrode electrically contacting the multi-layer semiconductor channel. The first TFT has a threshold voltage of about −0.5 V to about 2.5 V. The second TFT includes a single layer semiconductor channel disposed over the substrate, the single layer semiconductor channel having an electron mobility less than about 20 cm²/V s, a second bottom gate electrode disposed over the substrate, a second bottom insulator layer disposed over the second bottom gate electrode, a second source electrode electrically contacting the single layer semiconductor channel, and a second drain electrode electrically contacting the second semiconductor channel. The first TFT has an electron mobility of about 35 cm²/V·s to about 70 cm²/V s. The first TFT has a threshold voltage of about −0.5 V to about 2.5 V. The second TFT has a threshold voltage of about −0.5 V to about 2.5 V.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments herein include thin-film transistors (TFTs) that include channel layer stacks with layers having differing mobilities. The TFTs disclosed herein transport higher total current through both the low mobility and the high mobility channel layers and/or the high mobility channel layers due to higher carrier density in high mobility channel layer, which increases the response of speed of the TFTs due to higher on current in the TFTs. The TFTs further include a gate structure disposed over the channel layer stack. The gate structure includes one or more gate electrodes, and thus the TFTs are top-gate (TG), double-gate (DG), or bottom-gate (BG) TFTs. The channel layer stack includes a plurality of layers with differing mobilities. The layers with differing mobilities confer various benefits to the TFTs. The high mobility layer increases the speed of response of the TFTs. A low mobility layer allows more positive threshold voltage (turn on voltage) and lower leakage current than a high mobility layer in the same TFTs. The combination of the low mobility layer and the high mobility layer results in TFTs with improved qualities such as improved mobility, lower off leakage current, and positive threshold voltage (turn on voltage), as described herein. In addition, the channel layer stack has an effective mobility due to the combination of the layers therein. Embodiments disclosed herein can be useful for, but are not limited to, TFTs including channel layer stacks with layers having differing mobilities.

As used herein, the term "about" refers to a +/−10% variation from the nominal value. It is to be understood that such a variation can be included in any value provided herein.

FIGS. 1A-1D and 2A-2D illustrate schematic, cross-sectional views of TFTs, according to some embodiments. Any of the TFTs described herein are configured to operate as a traditional transistor in any conventional circuit. Any of the TFTs described herein can be included in a device.

Figure 1A:
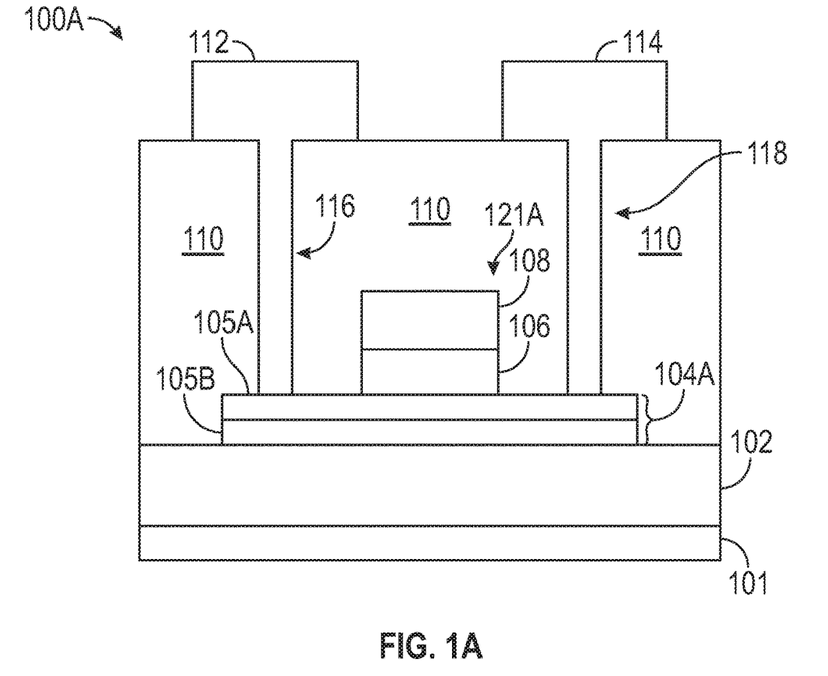
FIGS. 1A-1D illustrate schematic side views of thin-film transistors, according to some embodiments.

FIG. 1A illustrates a schematic, cross-sectional view of a TFT 100A, according to one embodiment. The TFT 100A can be considered a top-gate (TG) TFT. As shown, the TFT 100A includes a substrate 101, a gate structure 121A, a channel layer stack (alternatively referred to as a semiconductor channel) 104A, and an inter-layer dielectric (ILD) layer 110, a source electrode 112, and a drain electrode 114.

The substrate 101 can include any suitable material, such as silicon based substrates, semiconductor based substrates, insulating based substrates, germanium based substrates, and, in general, one or more generic layers that would be present in a complementary metal-oxide-semiconductor (CMOS) device structure. The substrate 101 can include a transparent material, such as rigid glass or flexible polyimides (PI), which can be useful if the TFT is used in LCD or OLED display applications, such as TVs, tablets, laptops, mobile phones or other displays.

In some embodiments, a buffer layer 102 is disposed over the substrate 101 and the channel layer stack 104A is disposed over the buffer layer 102. The ILD layer 110 is disposed over at least the channel layer stack 104A, the buffer layer 102, and the gate structure 121A. The source electrode 112 is disposed in a source electrode via 116 of the ILD layer 110. The drain electrode 114 is disposed in a drain electrode via 118 of the ILD layer 110.

The gate structure 121A is disposed over the channel layer stack 104A. The gate structure 121A is configured to modulate the voltage in the channel layer stack 104A. As shown, the gate structure 121A includes an insulator layer (alternatively referred to as a gate insulator layer) 106 and a gate electrode 108. The insulator layer 106 can include silicon dioxide. The gate electrode 108 is configured to be connected to a gate line signal as a power source (not shown) to provide a voltage across the channel layer stack 104A. The gate electrode 108 is disposed over the insulator layer 106. The gate electrode 108 includes a conducting material.

The buffer layer 102 can include insulating materials such as single silicon dioxide ($SiO_x$), silicon nitride ($SiN_x$), multi-layer silicon nitride/silicon oxide ($SiN_x/SiO_y$), silicon oxynitride (SiON), other insulating materials, or combinations thereof. The ILD layer 110 can include insulating materials such as $SiO_x$, $SiN_x$, other insulating materials, or combinations thereof, including $SiO_y/SiN_x$. The insulating layer 106 can include insulating materials such as silicon, $SiN_x$, other insulating materials, or combinations thereof. The gate electrode 108, the source electrode 112, and the drain electrode 114 each include conductive materials such as molybdenum (Mo), chromium (Cr), copper (Cu), titanium (Ti), tantalum (Ta), tungsten (W), alloy metals including MoW, combinations of conductive materials including MoW, TiCu, MoCu, MoCuMo, TiCuTi, MoWCu, MoWCuMoW, any electrically conductive materials, such as including conductive metal oxides, such as indium tin oxide (InSnO) [ITO] and indium zinc oxide (InZnO) [IZO], or any combination thereof.

The channel layer stack 104A is disposed over the substrate 101. The channel layer stack 104A includes one or more layers 105. In embodiments where the channel layer stack 104A includes a plurality of layers 105, the channel layer stack 104A can be referred to as a multi-layer channel layer stack (alternatively referred to as a multi-layer semiconductor channel). In embodiments where the channel layer stack 104A includes one layer 105, the channel layer stack 104A can be referred to as a single layer channel layer stack (alternatively referred to as a single layer semiconductor channel).

The layers 105 include any material that allows for conducting electrons and/or holes, as is given in more detail below. The one or more layers 105 can include two layers having alternating mobilities, such as a first layer 105A disposed over the buffer layer 102, and a second layer 105B disposed under the first layer. The first layer 105A has a mobility greater than the mobility of the second layer 105B, according to one embodiment. The first layer 105A has a mobility less than the mobility of the second layer 105B, according to one embodiment. The combination of the plurality of layers 105 results in the channel layer stack 104A having an effective mobility of from about 1 $cm^2/V$ s to about 70 $cm^2/V$ s, such as about 25 $cm^2/V$ s to about 45 $cm^2/V$ s, such as about 25 $cm^2/V$ s to about 35 $cm^2/V$ s, or from about 35 $cm^2/V$ s to about 45 $cm^2/V$ s.

In embodiments where the first layer 105A has a mobility greater than the mobility of the second layer 105b, the first layer 105A conducts a large portion of the current through the channel layer stack 104A, which allows the channel layer stack to effectively conduct current due to the high mobility of the first layer 105A. In these embodiments, TFTs can have higher off-leakage currents and negative threshold voltage due to higher carrier density at the interface between the insulating layer 106 and the high mobility channel (e.g., second layer 105B). Low off-leakage current and positive threshold voltage can be obtained by suppressing carrier density near the insulating layer 106, which can reduce mobility of the channel layer stack 104A. Therefore, there is a trade off between mobility and threshold voltage/off-leakage current. The combination of the plurality of layers 105 results in the channel layer stack 104A having an effective mobility greater than about 20 $cm^2/V \cdot s$. In one example, the TFT 100A with the ratio of width and length (W/L=40 um/10 um) of about 4 has a threshold voltage of about –1.0 V to about 1.0 V, a drain-source current of about 1E-12 A to about 8E-5 A at a gate-to-source voltage ($V_{GS}$) from about –20V to about 20V, a drain-to-source voltage ($V_{DS}$) of about 1 V, and a channel layer stack 104A mobility of about 25 $cm^2/V$ s to about 35 $cm^2/V$ s.

In embodiments where the first layer 105A has a mobility less than the mobility of the second layer 105B, the second layer 105B conducts a large portion of the current through the channel layer stack 104A, which allows the channel layer stack to effectively conduct current due to the high mobility of the second layer 105B. In addition, the lower mobility of the first layer 105A allows a reduced leakage current and more positive threshold voltage (turn on voltage) with respect to a TFT with a high mobility layer only. Therefore, higher effective mobility can be easily obtained with low off-leakage current and positive threshold voltage. The combination of the plurality of layers 105 results in the channel layer stack 104A having an effective mobility greater than 20 $cm^2/V \cdot s$. The first layer 105A has a mobility less than about 20 $cm^2/V \cdot s$, and the second layer 105B has a mobility greater than about 20 $cm^2/V \cdot s$, according to one embodiment. In one example, the TFT 100A with the ratio of width (W) and length (L) (W/L=40 um/10 um) about 4 has a threshold voltage of about –0.5 V to about 2.5 V, a drain-source current of about 1E-13 A to about 1E-4 A at a gate-to-source voltage ($V_{GS}$) of about –20 V to about 20 V, a drain-to-source voltage ($V_{DS}$) of about 1V, and a mobility of about 35 $cm^2/V$ s to about 70 $cm^2/V$ s.

In general, any of the TFTs disclosed herein have electron mobilities of about 35 $cm^2/V \cdot s$ to about 70 $cm^2/V$ s, threshold voltages of about –0.5 V to about 2.5 V, and drain-source currents of about 1E-13 A to about 1E-4 A at a gate-to-source voltage ($V_{GS}$) of about –20 V to about 20 V.

Figure 1B:
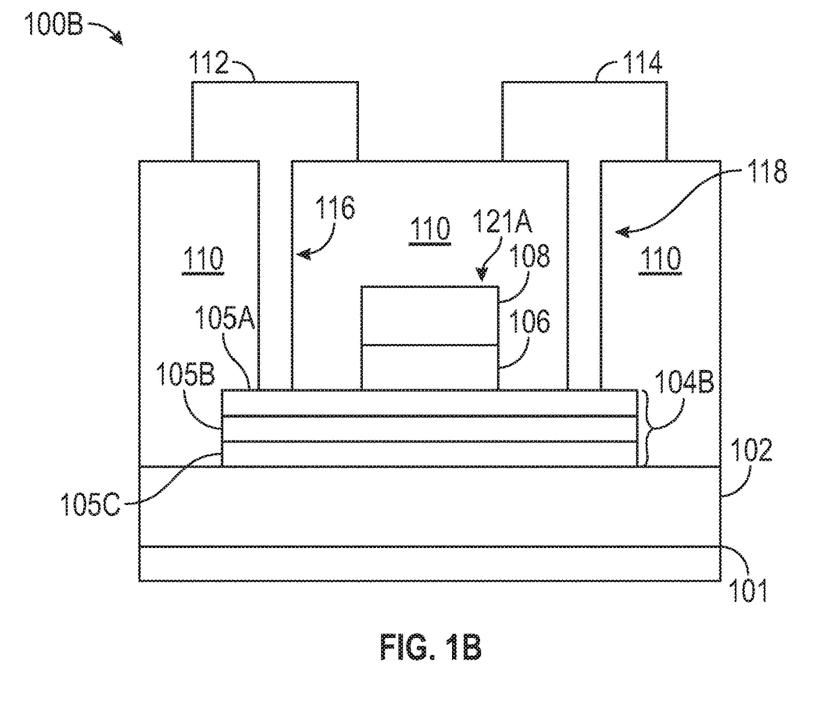

FIG. 1B illustrates a schematic cross-sectional view of a TFT 100B, according to one embodiment. The TFT 100B is similar to the TFT 100A (FIG. 1A), except that the TFT 100B includes a channel layer stack 104B rather than the channel layer stack 104A. The TFT 100B can be considered a TG TFT.

As shown, the channel layer stack 104B includes the plurality of layers 105, including the first layer 105A, the second layer 105B, and a third layer 105C. The third layer 105C is disposed over the buffer layer 102 and under the second layer 105B. The first layer 105A is directly in contact with the second layer 105B, as shown in FIG. 1B. In other embodiments, there are one or more additional layers disposed between the first layer 105A and the second layer 105B.

The plurality of layers 105 comprises an odd number of layers, according to some embodiments, such as three layers 105A, 105B, 105C shown in FIG. 1B. The first layer 105A has a lower mobility than the second layer 105B, the third layer 105C has a lower mobility than the second layer 105B, the second layer 105B is disposed closer to the buffer layer 102 than the first layer 105A, and the third layer 105C is disposed closer to the buffer layer 102 than the second layer 105B, according to one embodiment. The first layer 105A can have a same, greater, or lesser mobility than the third layer 105C. Each of the layers 105A, 105B, 105C includes indium (In), according to one embodiment. The first layer 105A and the third layer 105C have a mobility less than about 20 $cm^2/V \cdot s$, and the second layer 105B has a mobility greater than about 20 $cm^2/V \cdot s$, according to one embodiment.

Electrons are restricted to the second layer 105B, due to band bending between the second layer 105B and the first layer 105A, and band bending between the second layer 105B and the third layer 105C. The band bending is caused by the difference in band gaps and/or valence band maximums (VBM) between the first layer 105A and the second layer 105B, and/or between the second layer 105B and the third layer 105C. The increased number of electrons contained in the second layer 105B increases the free charge density in the second layer, increasing the current from the source electrode 112 to the drain electrode 114.

It is to be understood that although the TFTs 100A, 100B described herein include two layers 105A, 105B and three layers 105A, 105B, 105C, respectively, any number of layers can be included in the channel layer stacks 104A, 104B. For example, the channel layer stacks 104A, 104B include four, five, six, or even more layers 105 in certain embodiments. The layers 105 alternate such that each layer has a different mobility than adjacent layers. For example, the layers 105 alternate relatively high mobility and relatively low mobility, as described in further detail below.

The plurality of layers 105 include two high mobility layers and three low mobility layers, the high mobility layers disposed between adjacent low mobility layers, according to one embodiment. Electrons are restricted to the high mobility layers, due to band bending between the low mobility layers and the high mobility layers. The increased number of electrons contained in the high mobility layers increases the free charge density in the high mobility layers, increasing the current from the source electrode 112 to the drain electrode 114. In addition, using multiple high mobility layers further increases the current from the source electrode 112 to the drain electrode 114.

Figure 1C:
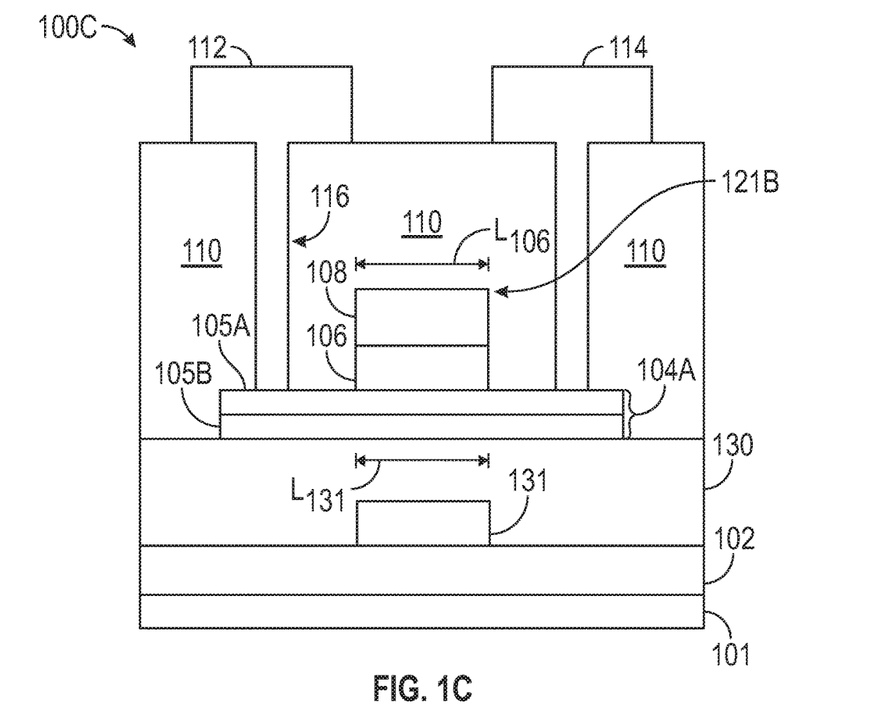

FIG. 1C illustrates a schematic side view of a TFT 100C, according to one embodiment. The TFT 100C is similar to the TFT 100A (FIG. 1A), except that the TFT 100C includes a gate structure 121B rather than the gate structure 121A. The TFT 100C can be considered a double-gate (DG) TFT.

The gate structure 121B is disposed over and under the channel layer stack 104A, as described in detail below. The gate structure 121B is configured to modulate the voltage in the channel layer stack 104A. As shown, the gate structure includes an insulator layer 106, a gate electrode 108, a bottom insulator layer 130, and a bottom gate electrode 131. Both the gate electrode 108 and the bottom gate electrode 131 are configured to be connected to one or more gate signal lines as power sources (not shown) to provide a voltage in the channel layer stack 104A. The same gate signal line or two different gate signal lines can be connected to the bottom gate electrode 131 and the gate electrode 108. The gate electrode 108 is disposed over the insulator layer 106. The bottom insulator layer 130 and the bottom gate electrode 131 are disposed over the buffer layer 102. The bottom insulator layer 130 can include silicon dioxide. The bottom gate electrode 131 includes a conducting material. The gate structure 121B, including both the gate electrode 108 and the bottom gate electrode 131, allows higher carrier densities in the channel layer stack 104A, increasing the mobility and current flowing therein.

As shown in FIG. 1C, the bottom gate electrode length $L_{131}$ is about the same as the gate electrode length $L_{106}$. In this embodiment, the bottom gate electrode length $L_{131}$ increases operation speed, and reduces parasitic capacitance, of the TFT 100C.

Figure 1D:
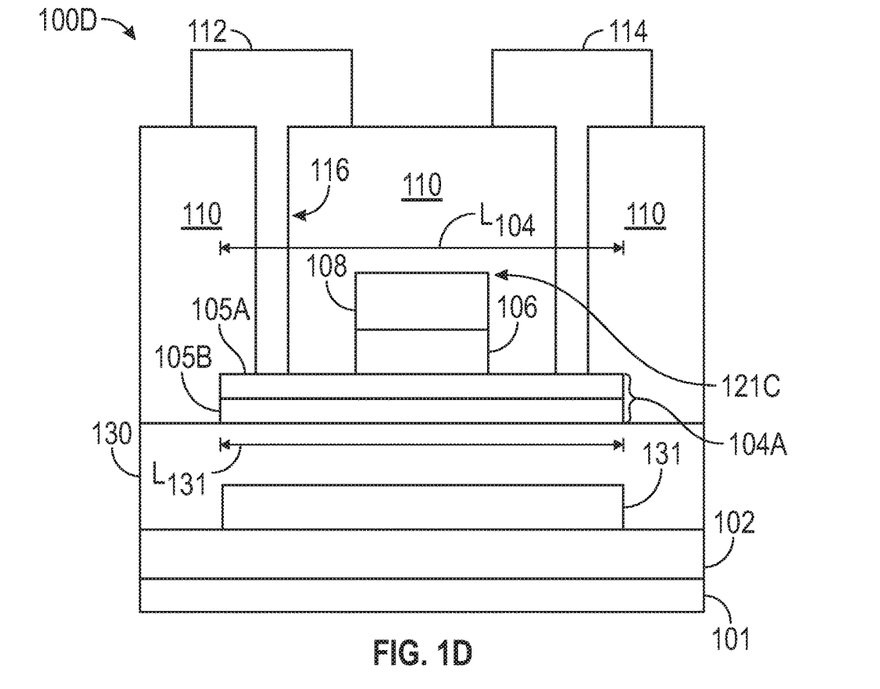

FIG. 1D illustrates a schematic side view of a TFT 100D, according to one embodiment. The TFT 100D is similar to the TFT 100C (FIG. 1C), except that the bottom gate electrode length $L_{131}$ is about the same as the channel layer stack length $L_{104}$. Thus, the bottom gate electrode length $L_{131}$ is larger than the gate electrode length $L_{106}$. The increased bottom gate electrode can decrease the operation speed of the TFT 100D due to increased parasitic capacitance compared to the TFT 100C shown in FIG. 1C. However, the increased bottom gate electrode length $L_{131}$ can block undesired illumination of light on the channel layer stack 104A.

Figure 2A:
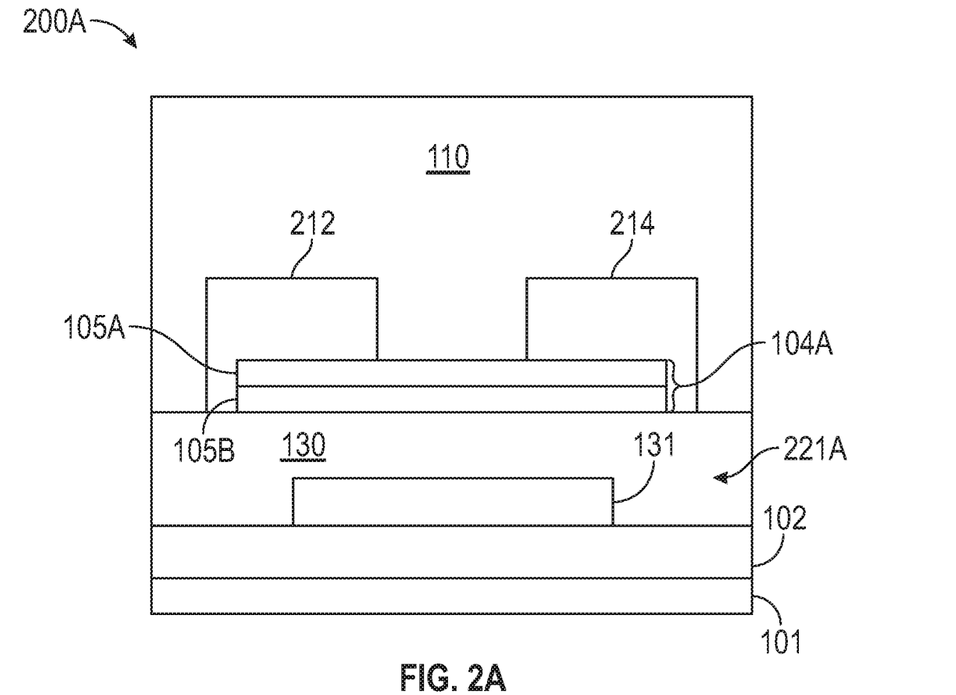
FIGS. 2A-2D illustrate schematic side views of thin-film transistors, according to some embodiments.

FIG. 2A illustrates a schematic side view of a TFT 200A, according to one embodiment. The TFT 200A is similar to the TFT 100C of FIG. 1C, except that the TFT 200A includes a different gate structure 221A. The gate structure 221A includes the bottom gate electrode 131. The bottom gate electrode 131 is configured to be connected to a gate signal as a power source (not shown) to provide a voltage in the channel layer stack 104A. As shown in FIG. 2A, a source electrode 212 and a drain electrode 214 are disposed directly over the channel layer stack 104A without use of a source electrode via or a drain electrode via. The TFT 200A can be considered a bottom-gate (BG) TFT.

Figure 2B:
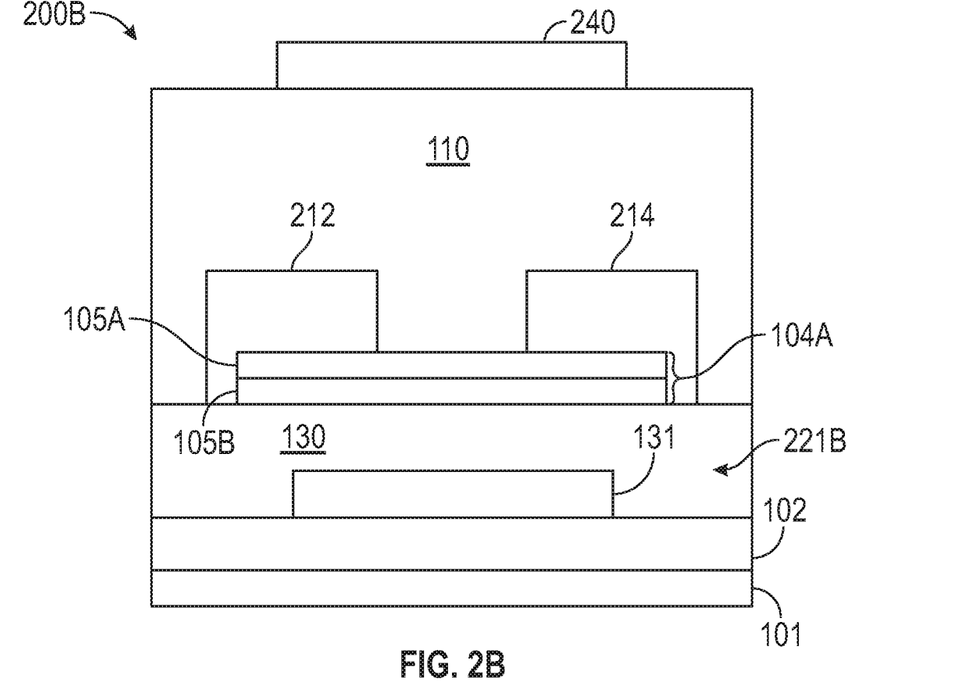

FIG. 2B illustrates a schematic side view of a TFT 200B, according to one embodiment. The TFT 200B is similar to the TFT 200A of FIG. 2A, except that the TFT 200B includes a different gate structure 221B. The gate structure 221B further includes a top gate electrode 240. The bottom gate electrode 131 and the top gate electrode 240 are configured to be connected to one or more gate signal lines as power sources (not shown) to provide a voltage in the channel layer stack 104A. The same gate signal line or two difference gate signal lines can be connected to the bottom gate electrode 131 and the top gate electrode 240. The top gate electrode 240 includes a conducting material. The TFT 200B can be considered a DG TFT.

Figure 2C:
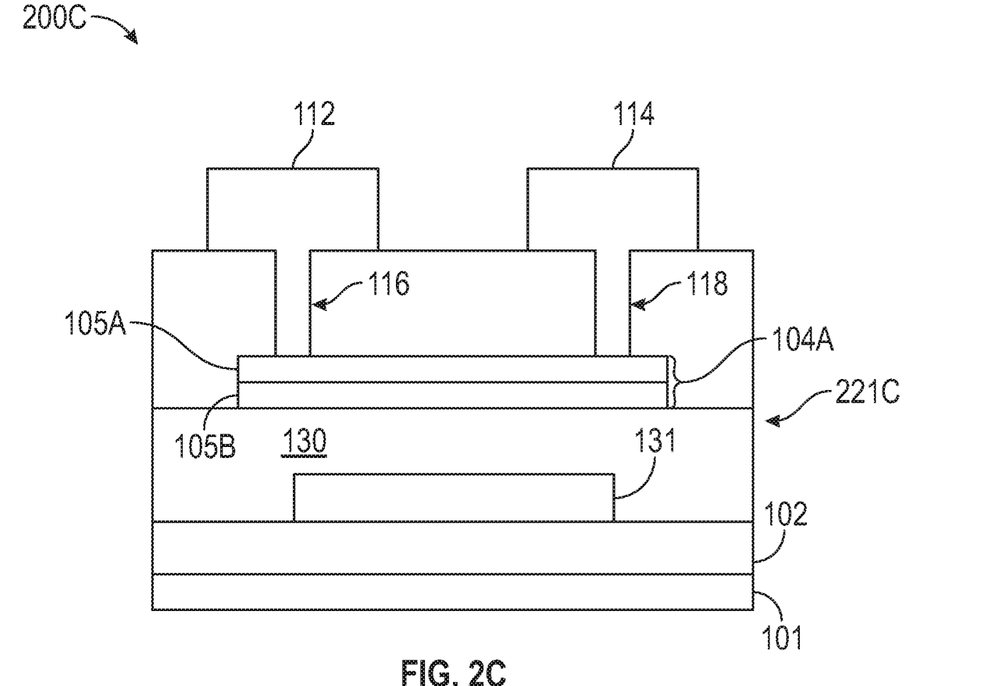

FIG. 2C illustrates a schematic side view of a TFT 200C, according to one embodiment. The TFT 200C is similar to the TFT 200A of FIG. 2A, except that the TFT 200A includes a different gate structure 221C. The gate structure 221C includes the bottom gate electrode 131. As shown in FIG. 2C, the source electrode 112 and the drain electrode 114 are connected to the channel layer stack 104A by the source electrode via 116 and the drain electrode via 118. The TFT 200C can be considered a BG TFT. The bottom gate electrode 131 is configured to be connected to a gate signal line as a power source (not shown) to provide a voltage in the channel layer stack 104A.

Figure 2D:
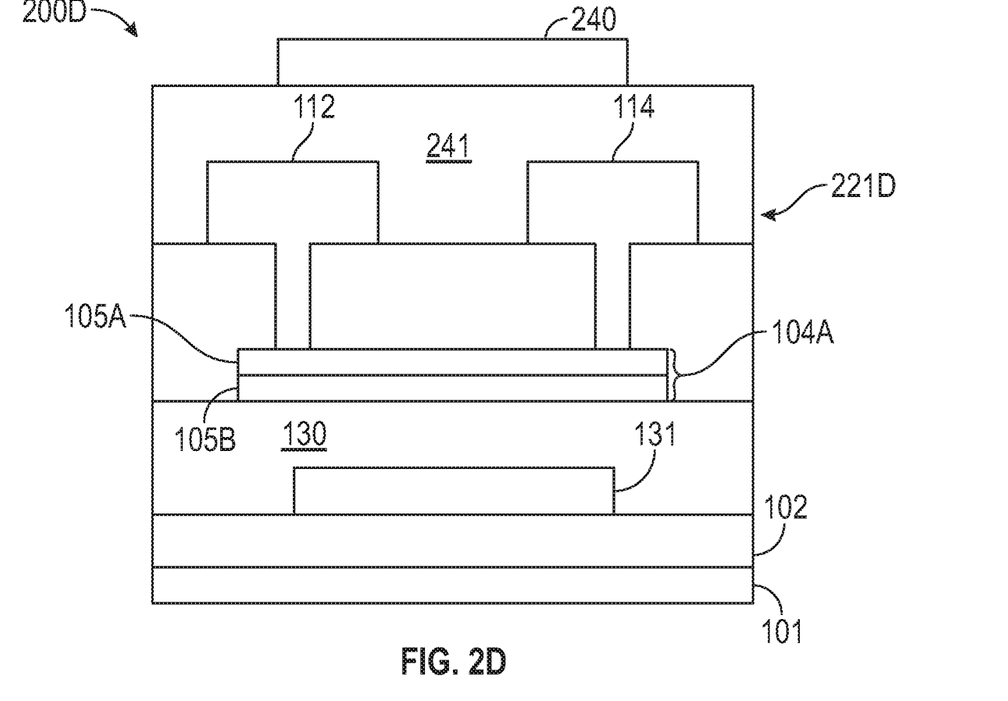

FIG. 2D illustrates a schematic side view of a TFT 200D, according to one embodiment. The TFT 200D is similar to the TFT 200C of FIG. 2A, except that the TFT 200D includes a different gate structure 221D. The gate structure 221D further includes the bottom gate electrode 131 and the top gate electrode 240. As shown in FIG. 2D, the source electrode 112 and the drain electrode 114 are connected to the channel layer stack 104A by the source electrode via 116 and the drain electrode via 118. The TFT 200D can be considered a DG TFT. The bottom gate electrode 131 and the top gate electrode 240 are configured to be connected to one or more gate signal lines as power sources (not shown) to provide a voltage in the channel layer stack 104A. The same gate signal line or two difference gate signal lines can be connected to the bottom gate electrode 131 and the top gate electrode 240.

Figure 3A:
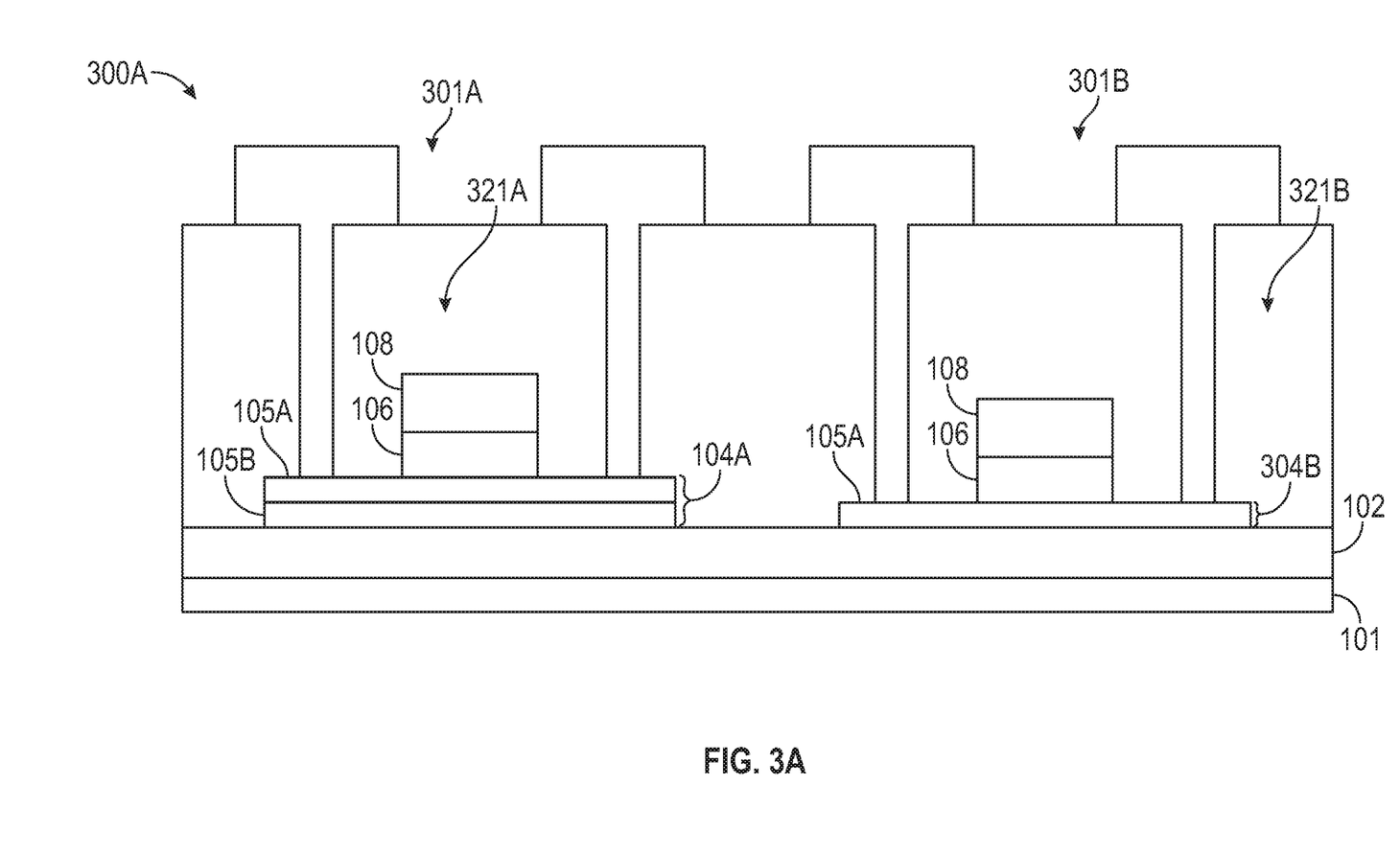
FIGS. 3A-3G illustrate schematic side views of devices, according to some embodiments.

FIG. 3A illustrates a schematic side view of a device 300A, according to one embodiment. As shown, the device 300A includes a first TFT 301A and a second TFT 301B. As shown, the first TFT 301A includes a gate structure 321A. The first TFT 301A is similar to the TFT 100A of FIG. 1A. The channel layer stack 304B is similar to the channel layer stack 104A. As shown, the second TFT 301B includes a gate structure 321B. The second TFT 301B is similar to the TFT 100A of FIG. 1A, but the second TFT 301B includes a channel layer stack 304B. The channel layer stack 304B, as shown, includes the first layer 105A. The layer 105A from the channel layer stack 304B in the second TFT 301B can be the same layer or can be a different layer compared to the first layer 105A from the channel layer stack 104A in the first TFT 301A.

Figure 3B:
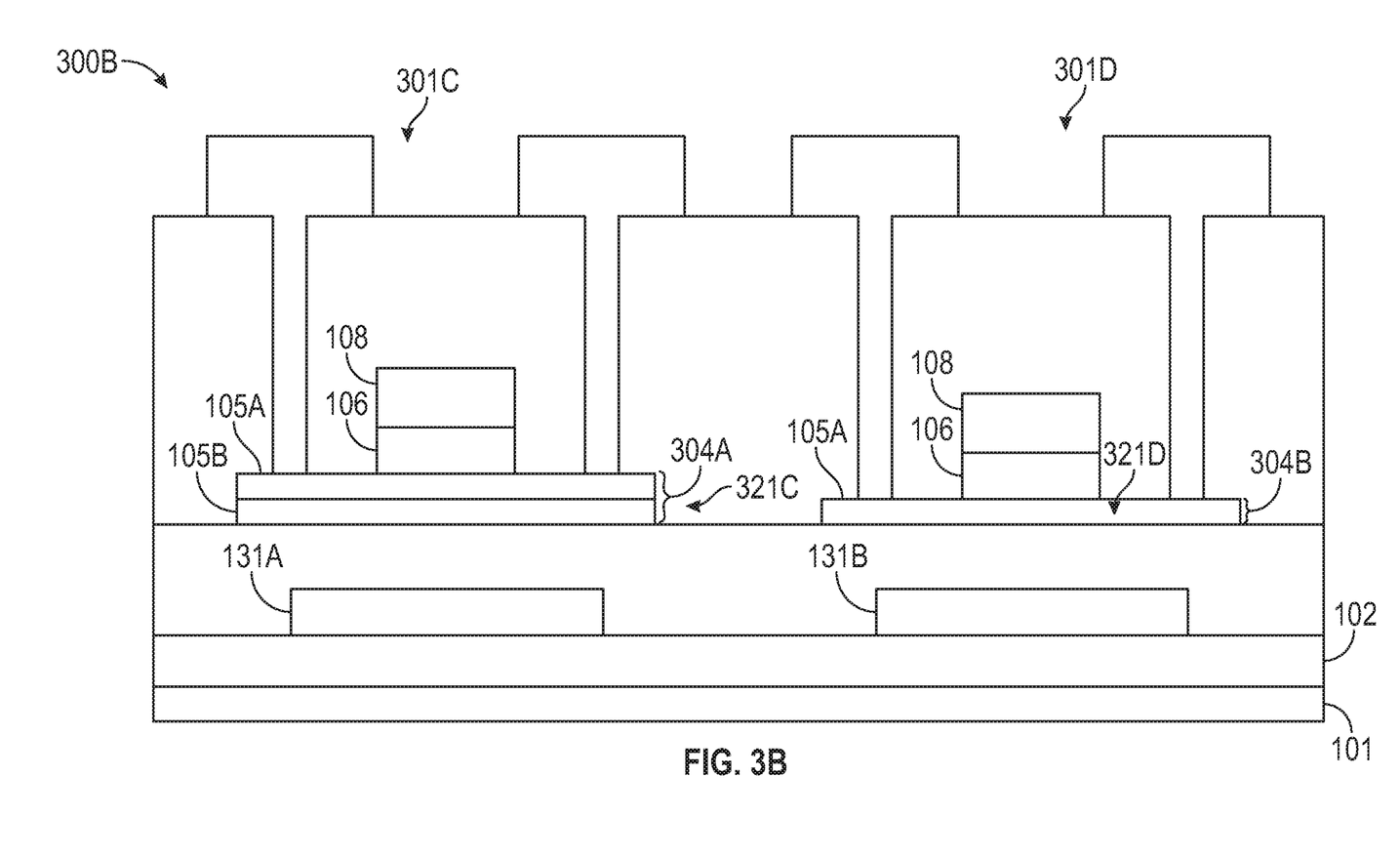

FIG. 3B illustrates a schematic side view of a device 300B, according to one embodiment. As shown, the device 300B includes a first TFT 301C and a second TFT 301D. As shown, the first TFT 301C includes a gate structure 321C. The first TFT 301C is similar to the TFT 301A of FIG. 3A. However, as shown, the second TFT 301D includes a gate structure 321D. The gate structures 321C, 321D further include bottom gate electrodes 131A, 131B respectively.

Figure 3C:
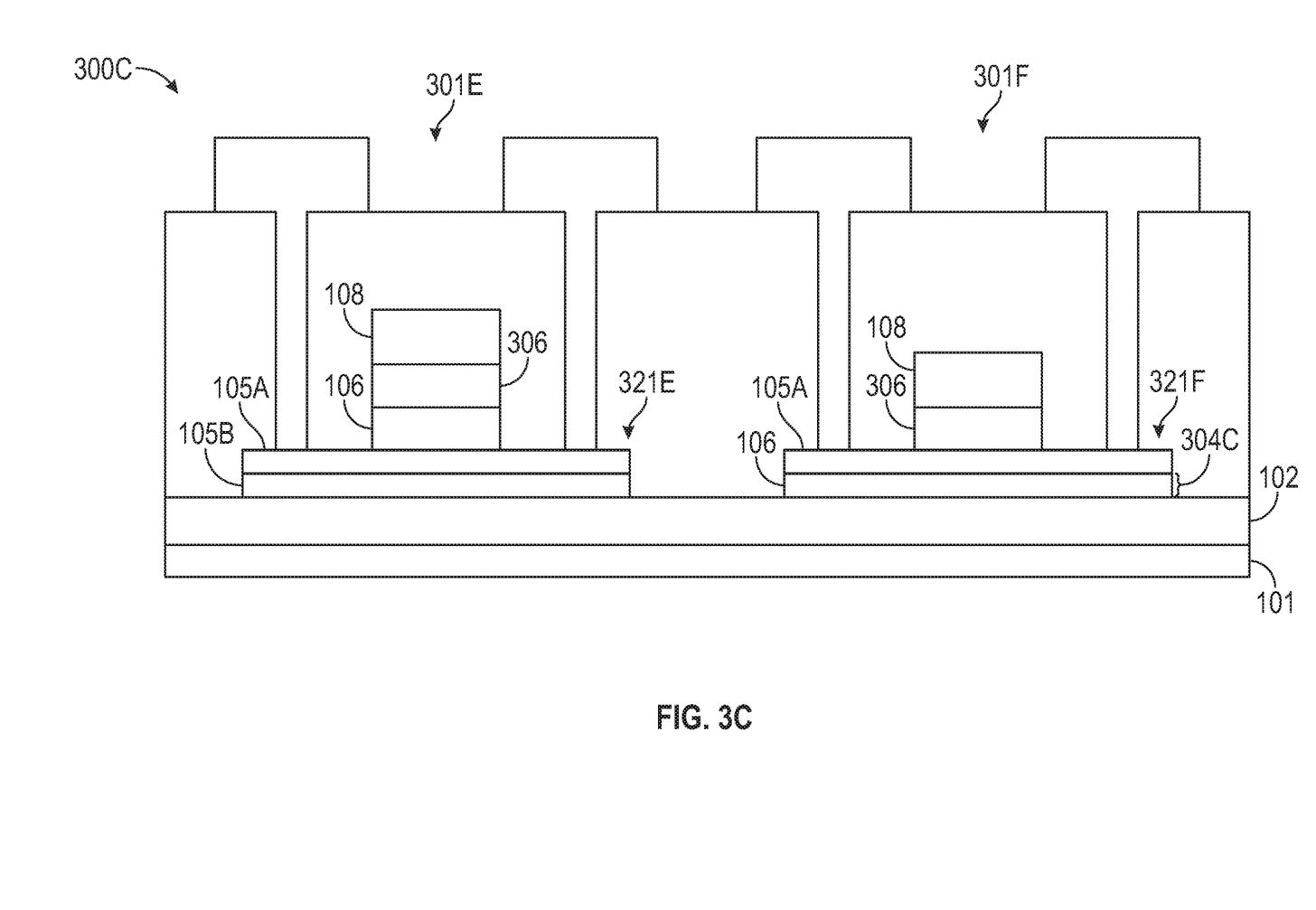

FIG. 3C illustrates a schematic side view of a device 300C, according to one embodiment. As shown, the device 300C includes a first TFT 301E and a second TFT 301F. As shown, the first TFT 301E includes a gate structure 321E. The first TFT 301E is similar to the TFT 301A of FIG. 3A. As shown, the second TFT 301F includes a gate structure 321F. The gate structures 321E, 321F further include secondary insulating layers 306 disposed between insulating layer 106 and the gate electrode 108. The secondary insulating layer 306 can include any material disclosed above in the insulating layer 106.

Figure 3D:
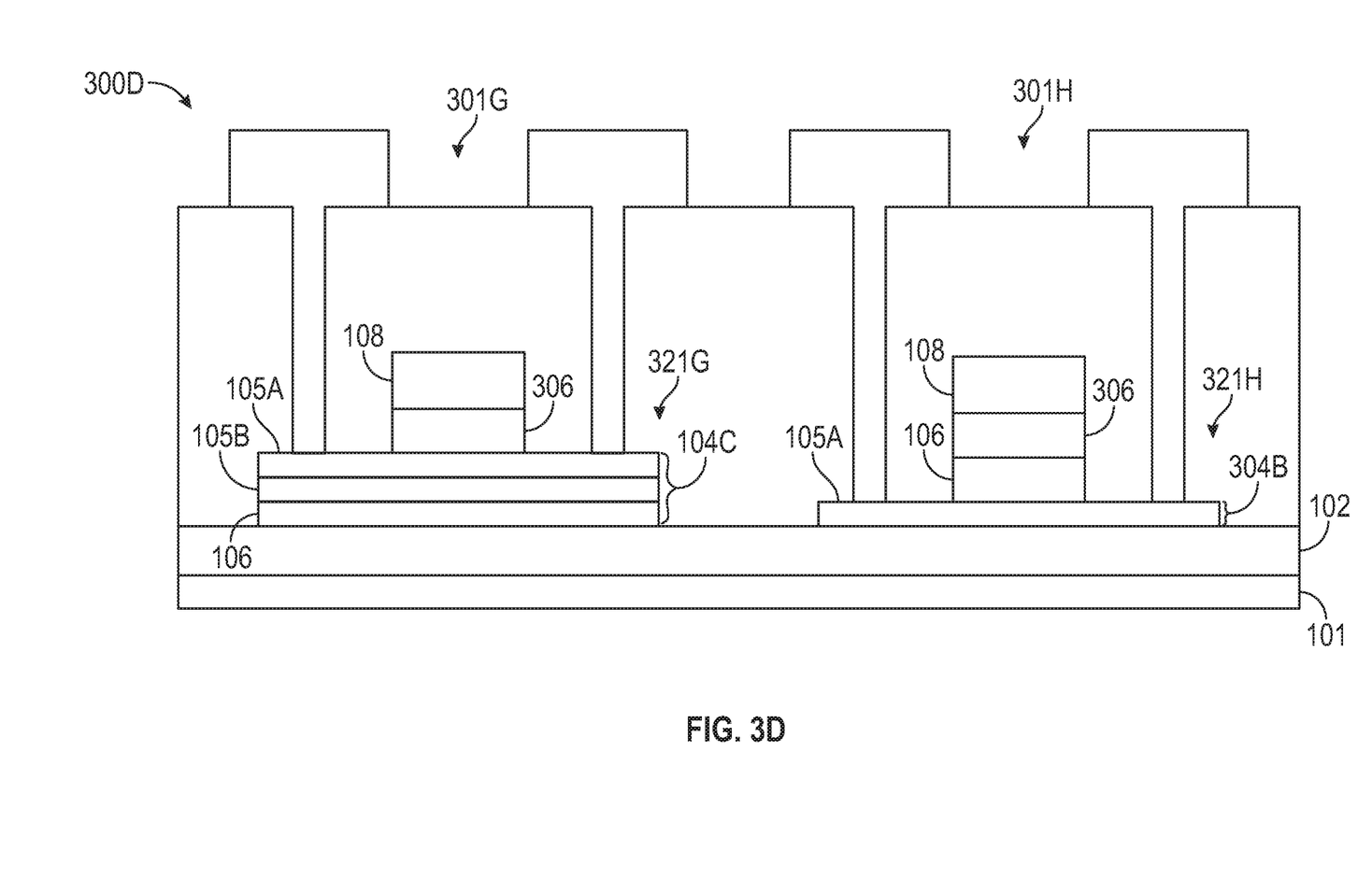

FIG. 3D illustrates a schematic side view of a device 300D, according to one embodiment. As shown, the device 300D includes a first TFT 301G and a second TFT 301H. As shown, the first TFT 301G includes a gate structure 321G. The first TFT 301G is similar to the TFT 301A of FIG. 3A, except that the first TFT 301G includes a channel layer stack 104C. As shown, the channel layer stack 104C further includes the insulating layer 106 disposed under the second layer 105B. As shown, the second TFT 301H includes a gate structure 321H. The gate structure 321H further include the secondary insulating layer 306 disposed between the insulating layer 106 and the gate electrode 108.

Figure 3E:
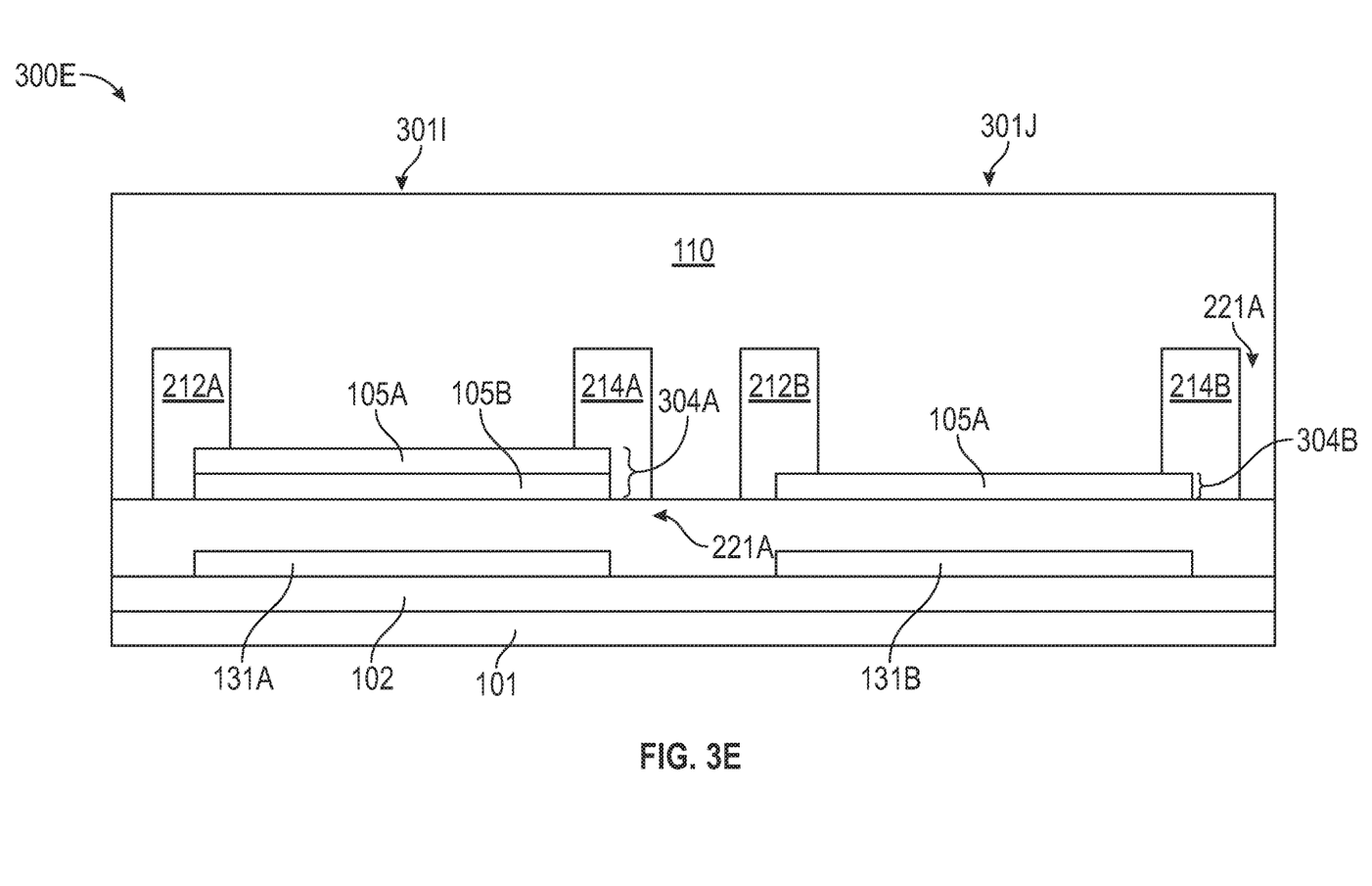

FIG. 3E illustrates a schematic side view of a device 300E, according to one embodiment. As shown, the device 300E includes a first TFT 301I and a second TFT 301J. As shown, the first TFT 301I includes a gate structure 221A. The first TFT 301I is similar to the TFT 200A of FIG. 2A. As shown, the second TFT 301J includes a gate structure 221A. The second TFT 301J is similar to the TFT 200A of FIG. 2A, with the exception that the TFT 301J includes the channel layer stack 304B (that is, the channel layer stack 304B includes the first layer 105A). The first layer 105A of the channel layer stack 304B is a low mobility layer (described below). The source electrodes 212A, 212B and the drain electrode 214A, 214B are in electrical contact with the channel layer stacks 304A, 304B, respectively.

In some embodiments, one or both of the TFTs 301I, 301J further include a top gate electrode (e.g., top gate electrode 240A and/or top gate electrode 240B) disposed over the ILD layer 110.

Figure 3F:
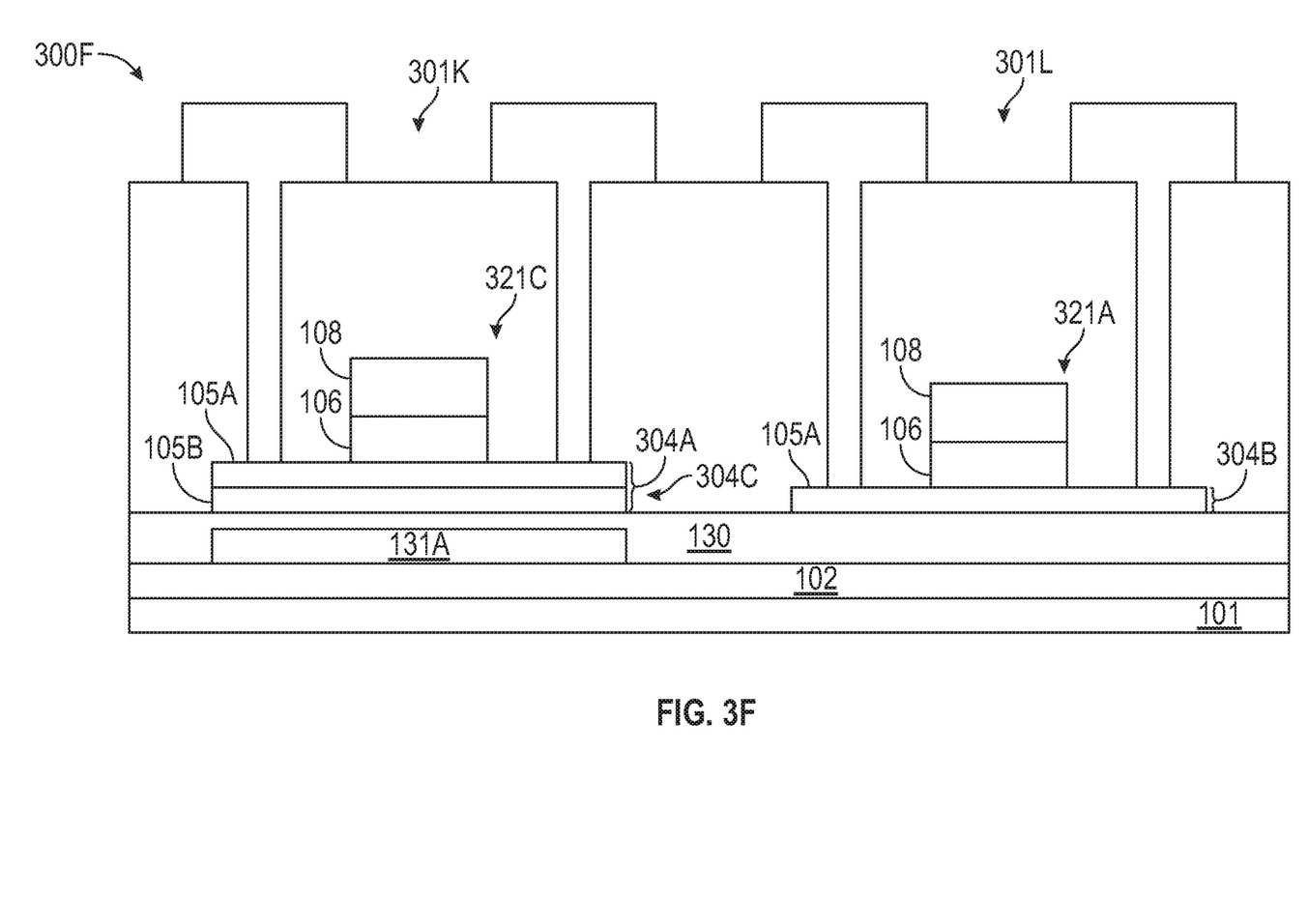

FIG. 3F illustrates a schematic side view of a device 300F, according to one embodiment. As shown, the device 300F includes a first TFT 301K and a second TFT 301L. As shown, the first TFT 301K includes the gate structure 321C. The first TFT 301K is similar to the TFT 301C of FIG. 3B. As shown, the second TFT 301L includes the gate structure 321A. The second TFT 301L is similar to the second TFT 301B of FIG. 3A. In some embodiments, the first TFT 301K includes the gate structure 321A instead of the gate structure 321C, and the second TFT includes the gate structure 321C instead of the gate structure 321A.

In some embodiments, the first layer 105A from the channel layer stack 304A in the first TFT 301K is different than the first layer 105A from the channel layer stack 304B in the second TFT 301L. In some embodiments, the first layer 105A in the first TFT 301K is a high mobility layer (described below), and the first layer 105A in the second TFT 301L is a low mobility layer (described below). In some embodiments, the first layer 105A in the first TFT 301K is a low mobility layer, and the first layer 105A in the second TFT 301L is a high mobility layer.

Figure 3G:
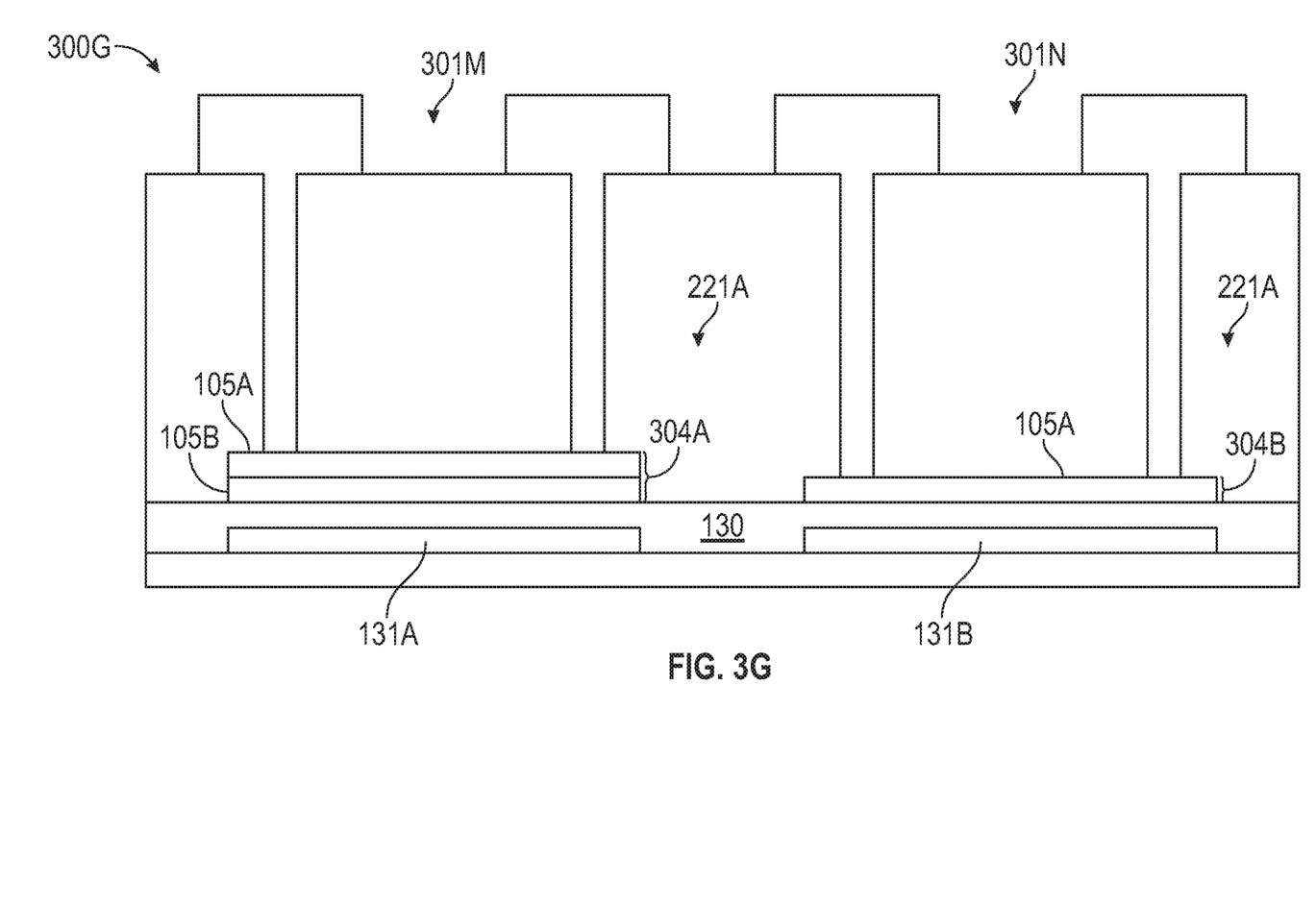

FIG. 3G illustrates a schematic side view of a device 300G, according to one embodiment. As shown, the device 300G includes a first TFT 301M and a second TFT 301N. As shown, the first TFT 301M includes a gate structure 221A. The first TFT 301M is similar to the TFT 200A of FIG. 2A. As shown, the second TFT 301N includes a gate structure 221A.

In some embodiments, the first layer 105A from the channel layer stack 304A in the first TFT 301M is different than the first layer 105A from the channel layer stack 304B in the second TFT 301N. In some embodiments, the first layer 105A in the first TFT 301M is a high mobility layer (described below), and the first layer 105A in the second TFT 301N is a low mobility layer (described below). In some embodiments, the first layer 105A in the first TFT 301M is a low mobility layer, and the first layer 105A in the second TFT 301N is a high mobility layer. In some embodiments, one or both of the TFTs 301M, 301N include a top gate electrode (not shown) disposed over the ILD layer 110.

Although the TFTs disclosed herein are illustrated as including a specific channel layer stack (e.g., channel layer stack 104A) and/or (e.g., gate structure 121A), it is to be understood that the TFTs can instead include any of the channel layer stacks disclosed herein and/or any of the gate structures disclosed herein. Said another way, the channel layer stack of the TFTs can include one, two, three, four, five, six, or even more individual layers 105. The layers 105 alternate such that each layer has a different mobility than adjacent layers. For example, the layers 105 alternate relatively high mobility and relatively low mobility, as described in further detail below. In addition, any channel layer stack can further include the first insulator layer 106 and/or the secondary insulating layer 306. In addition, any gate structure described herein can be included in any of the disclosed TFTs, and thus each TFT can be a TG, BG, or DG TFT.

In any of the embodiments described above, the TFTs share the substrate 101. In some embodiments, the two-gate structure further includes the buffer layer 102, and the two TFTs share the buffer layer. It is to be understood that any of the two-gate structures disclosed herein can include the buffer layer 102. The two TFTs in each two-gate structure are used as a LCD or OLED display pixel circuits, or in gate driver in panel (GIP) circuits. For example, each of the TFTs in the two-gate structure can be used as switching or driving TFTs in OLED pixel circuits.

In one embodiment, which can be combined with other embodiments described herein, each of the layers 105 (e.g., layers 105A, 105B, and/or 105C) have a thickness of about 0.5 nm to about 50 nm. In another embodiment, which can be combined with other embodiments described herein, the mobility of each of the layers 105 is either greater than about 20 cm$^2$/V·s or less than about 20 cm$^2$/V·s. For example, the channel layer stack 104B includes alternating layers 105, wherein each layer alternately has a mobility of greater than about 20 cm$^2$/V·s (referred to herein as a high mobility layer) and less than about 20 cm$^2$/V·s (referred to herein as a low mobility layer). It is understood that the mobility of 20 cm$^2$/V·s is an example, and any high mobility layer having a mobility relatively higher than the corresponding low mobility layer is covered by the disclosure herein.

In one embodiment, which can be combined with other embodiments described herein, the high mobility layers and the low mobility layers have material compositions that are substantially the same. In another embodiment, which can be combined with other embodiments described herein, the high mobility layers and the low mobility layers have different material compositions.

In one embodiment, which can be combined with other embodiments described herein, the high mobility layer and/or the low mobility layer include indium (In), zinc (Zn), gallium (Ga), oxygen (O), tin (Sn), aluminum (Al), and/or hafnium (Hf). Examples of the high mobility layer include, but are not limited to, In—Ga—Zn—O, In—Ga—O, In—Zn—O, In—Ga—Sn—O, In—Zn—Sn—O In—Ga—Zn—Sn—O, In—Sn—O, Hf—In—Zn—O, Ga—Zn—O, In—O, Al—Sn—Zn—O, Zn—O, Zn—Sn—O, Al—Zn—O, Al—Zn—Sn—O, Hf—Zn—O, Sn—O, and Al—Sn—Zn—In—O. Examples of the low mobility layer include, but are not limited to, In—Ga—Zn—O, Ga—O, In—Ga—O, Zn—

Sn—O, In—Sn—O, Hf—In—Zn—O, Al—Sn—Zn—O, Zn—O, Al—In—Zn—Sn—O, and Al—Sn—Zn—O.

In some embodiments, the material of the high mobility layer and the low mobility layer includes the same elements, but the stoichiometry of the material differs. For example, In—Ga—Zn—O is a multi-component amorphous oxide semiconductor (AOS) system and is commercially used for mass production of LCD and OLED display products. In—Ga—Zn—O typically shows mobility values of about 10 cm$^2$/V·s with 1:1:1 ratios of In—O, Ga—O, and Zn—O, but it is also possible to achieve mobility larger than 10 cm$^2$/V·s by increasing In and/or reducing Ga compositions from In—Ga—Zn—O AOS systems. Therefore, mobility is adjustable by changing the compositions of components in AOS systems. Zn—O or In—O without Ga in AOS systems allow higher mobility (higher carrier concentration), but it can be difficult to obtain an amorphous phase. However, binary components such as Zn—In—O or Zn—Ga—O can form amorphous phases due to changing composition of Zn—O and In—O. For high mobility (>20 cm$^2$/V·s) AOS, it is possible to increase carrier concentration by increasing the composition of In and/or decreasing the composition of Ga from multi-component AOS systems. Thus, in one embodiment, the low mobility layer includes In—Ga—Zn—O, the high mobility layer includes In—Ga—Zn—O, and the high mobility layer has a higher composition of In than the low mobility layer. In another embodiment, the low mobility layer includes In—Ga—Zn—O, the high mobility layer includes In—Ga—Zn—O, and the high mobility layer has a lower composition of Ga than the low mobility layer. In yet another embodiment, the low mobility layer includes In—Ga—Zn—O, the high mobility layer includes In—Ga—Zn—O, the high mobility layer has a higher composition of In than the low mobility layer, and the high mobility layer has a lower composition of Ga than the low mobility layer.

It is to be understood that the composition of In, Ga, Zn, and O can easily change electron transport properties (e.g., mobilities). For example, electron transport properties (e.g., mobilities) of In$_2$O$_3$—Ga$_2$O$_3$—ZnO (In—Ga—Zn—O) thin films are determined by the composition of In$_2$O$_3$, Ga$_2$O$_3$, and ZnO by changing X, Y, and Z, where X is defined by [(ZnO)$_X$—(Ga$_2$O$_3$)$_{1-X}$] mol %, Y is defined by [(Ga$_2$O$_3$)$_Y$—(In$_2$O$_3$)$_{1-Y}$] mol %, and Z is defined by (In$_2$O$_3$)$_Z$—(ZnO)$_{1-Z}$] mol %. In the In—Ga—Zn—O system, it is generally understood that the In atoms contained therein act as In$^{3+}$ ions that form electron pathways, which leads to high electron mobility. In addition, it is understood that Zn atoms contained therein act as Zn$^{2+}$ ions that prefer tetrahedral coordination, which increases stability of an amorphous phase of In—Ga—Zn—O. Finally, it is understood that Ga atoms contained therein act as Ga$^{3+}$ ions that suppress carrier generation due to the high ionic field strength of the Ga$^{3+}$ ions. Ga$^{3+}$ ions form stronger chemical bonds with O atoms than the Zn and In atoms, due to O vacancy formation. Thus, increasing the Ga percentage leads to low mobility and/or carrier concentration, and thus a layer containing high Ga percentage leads to a low off current and large on/off current ratio.

If X=Y=Z=0.5, In—Ga—Zn—O allows a mobility of about 9 cm$^2$/V·s. Higher mobility can be controlled by decreasing Ga and increasing In. For example, if X=1, Y=0, Z=1, the composition is In—O. If X=1, Y=0, Z=0, the composition is Zn—O. However, In—O and Zn—O form a crystalline phase. If X=1, Y=0, 0<Z<1, the composition is In—Zn—O. Therefore, In—Zn—O has an amorphous phase and mobility larger than about 20 cm$^2$/V·s, which can be the material of the high mobility channel layer. In—Ga—Zn—O has an amorphous phase and lower mobility less than about 20 cm$^2$/V·s, which can be the material of the low mobility channel layer.

The AOS systems can include In—Ga—Zn—O, or other AOS including In—Zn—O, Zn—Sn—O, In—Ga—O, In—Zn—O, In—Ga—Sn—O, In—Zn—Sn—O In—Ga—Zn—Sn—O, In—Sn—O, Hf—In—Zn—O, Ga—Zn—O, In—O, Al—Sn—Zn—O, Zn—O, Zn—Sn—O, Al—Zn—O, Al—Zn—Sn—O, Hf—Zn—O, Sn—O, Al—Sn—Zn—In—O, and the like.

As described above, a TFT is provided. The TFT includes a gate structure and a channel layer stack. The gate stack includes one or more gate structures, and thus the TFT is a TG, DG, or BG TFT. The channel layer stack includes a plurality of layers with differing mobilities.

The layers with differing mobilities confer various benefits to the TFT. The high mobility layer increases the speed of response of the TFT. The low mobility layer reduces leakage current and allows positive threshold voltage (turn on voltage) in the TFT. The combination of the low mobility layer and the high mobility layer results in a TFT with improved qualities such as improved mobility, lower off leakage current, and positive threshold voltage (turn on voltage), as described herein.

While the foregoing is directed to examples of the present disclosure, other and further examples of the disclosure may be devised without departing from the basic scope thereof, and the scope thereof is determined by the claims that follow.

What is claimed is:

1. A device, comprising:
 a substrate;
 a buffer layer disposed over the substrate;
 a first semiconductor channel of a first thin film transistor (TFT), the first semiconductor channel disposed over the buffer layer, the first semiconductor channel having only two layers, the two layers being:
  a first layer having a first electron mobility; and
  a second layer contacting a lowermost surface of the first layer, wherein the second layer is disposed on the buffer layer and contacts the buffer layer, the second layer having a second electron mobility, and wherein the second layer comprises an electron mobility greater than the first layer wherein the first TFT has an electron mobility of about 35 cm$^2$/V·s to about 70 cm$^2$/V s;
 a first gate insulator layer, the first gate insulator layer contacting the uppermost surface of the first layer;
 a first gate electrode disposed over the first gate insulator layer of the first TFT;
 a first inter-layer dielectric (ILD) layer disposed over the first gate electrode, the first ILD layer contacting both sides of the first gate insulator layer and contacting the uppermost surface of the first layer;
 a first source electrode contacting the first layer of the first semiconductor channel, the first source electrode disposed in a source electrode via of the ILD layer; and
 a first drain electrode contacting the first layer of the first semiconductor channel, the first drain electrode disposed in a first drain electrode via of the ILD layer.

2. The device of claim 1, further comprising:
 a second semiconductor channel of a second TFT disposed over the substrate, the second semiconductor channel having an electron mobility less than the electron mobility of the second layer of the first TFT, wherein the second semiconductor channel is in contact with a second gate insulator layer of the second TFT, the second gate insulator layer disposed over the second semiconductor channel;

a second gate electrode disposed over the second gate insulator layer;

a second source electrode contacting the second semiconductor channel, the second source electrode disposed in a second source electrode via of the ILD layer; and a second drain electrode contacting the second semiconductor channel, the second drain electrode disposed in a second drain electrode via of the ILD layer, wherein the second TFT has a threshold voltage of about −1.5 V to about 2.5 V.

3. The device of claim 2, wherein the second TFT has an electron mobility of about 35 cm$^2$/V·s to about 70 cm$^2$/V s, wherein the first TFT has a threshold voltage of about −1.5 V to about 2.5 V.

4. The device of claim 1, wherein each layer of the semiconductor channel has a thickness from about 0.5 nm to about 50 nm.

5. The device of claim 1, wherein the first electron mobility is less than about 20 cm$^2$/V s and the second electron mobility is greater than about 20 cm$^2$/V s, wherein the first gate insulator layer disposed over the first semiconductor channel.

6. The device of claim 1, wherein the second layer is free of Sn.

7. The device of claim 1, wherein at least one layer of the semiconductor channel is free of Zn.

8. A device, comprising:
a substrate;
a buffer layer disposed over the substrate;
a first semiconductor channel of a first thin film transistor (TFT), the first semiconductor channel disposed over the buffer layer, the first semiconductor channel having only two layers, the two layers being:
  a first layer having a first electron mobility; and
  a second layer contacting a lowermost surface of the first layer, wherein the second layer is disposed on the buffer layer and contacts the buffer layer, the second layer having a second electron mobility greater than the first layer;

a first gate insulator layer, the first gate insulator layer contacting the uppermost surface of the first layer a first gate electrode disposed over the first gate insulator layer of the first TFT;

a first inter-layer dielectric (ILD) layer disposed over a first gate electrode, the first the ILD layer contacting both sides of the first gate insulator layer and contacting the uppermost surface of the first layer;

a first source electrode contacting the first layer of the first semiconductor channel the first source electrode disposed in a source electrode via of the ILD layer; and a first drain electrode contacting the first layer of the first semiconductor channel, the first drain electrode disposed in a drain electrode via of the ILD layer; and a second semiconductor channel of a second TFT the second semiconductor channel disposed over the substrate, the second semiconductor channel having an electron mobility less than the electron mobility of the second layer of the first TFT, wherein the second semiconductor channel is in contact with a second gate insulator layer of the second TFT, the second gate insulator layer disposed over the second semiconductor channel;

a second gate electrode disposed over the second gate insulator layer;

a second source electrode contacting the second semiconductor channel, the second source electrode disposed in a second source electrode via of the ILD layer; and a second drain electrode contacting the second semiconductor channel the second drain electrode disposed in a second drain electrode via of the ILD layer.

* * * * *